(12) United States Patent
Fruehling et al.

(10) Patent No.: US 10,589,986 B2
(45) Date of Patent: Mar. 17, 2020

(54) PACKAGING A SEALED CAVITY IN AN ELECTRONIC DEVICE

(71) Applicant: TEXAS INSTRUMENTS INCORPORATED, Dallas, TX (US)

(72) Inventors: Adam Joseph Fruehling, Garland, TX (US); Juan Alejandro Herbsommer, Allen, TX (US); Simon Joshua Jacobs, Lucas, TX (US); Benjamin Stassen Cook, Addison, TX (US); James F. Hallas, Allen, TX (US); Randy Long, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/696,245

(22) Filed: Sep. 6, 2017

(65) Prior Publication Data
US 2019/0071304 A1    Mar. 7, 2019

(51) Int. Cl.
| | |
|---|---|
| *B81B 7/00* | (2006.01) |
| *H03L 7/26* | (2006.01) |
| *G01L 7/08* | (2006.01) |
| *G04F 5/14* | (2006.01) |
| *G01M 3/32* | (2006.01) |
| *G01L 9/00* | (2006.01) |

(52) U.S. Cl.
CPC ............ *B81B 7/0041* (2013.01); *G01L 7/084* (2013.01); *G01L 9/0016* (2013.01); *G01L 9/0051* (2013.01); *G01M 3/3272* (2013.01); *G04F 5/14* (2013.01); *H03L 7/26* (2013.01); *B81B 2201/058* (2013.01); *B81B 2203/0127* (2013.01); *B81B 2203/0315* (2013.01); *B81B 2207/012* (2013.01); *B81B 2207/096* (2013.01); *B81B 2207/097* (2013.01)

(58) Field of Classification Search
CPC ............ B81B 7/0041; B81B 2207/012; B81B 2207/096; B81B 2201/058; B81B 2203/0315; B81B 2203/0127; B81B 2207/097; H03L 7/26; G04F 5/14; G04F 7/00; G01L 7/084
USPC ........................................................ 257/417
See application file for complete search history.

(56) References Cited

U.S. PATENT DOCUMENTS

| | | |
|---|---|---|
| 4,147,431 A | 4/1979 | Mann |
| 4,826,616 A | 5/1989 | Tanino |
| (Continued) | | |

FOREIGN PATENT DOCUMENTS

| | | |
|---|---|---|
| JP | 6428974 | 1/1989 |
| WO | 2014037016 | 3/2014 |
| WO | 2016161216 | 10/2016 |

OTHER PUBLICATIONS

International Search Report for PCT/US2018/049513 dated Nov. 15, 2018.

(Continued)

*Primary Examiner* — Caleen O Sullivan
(74) *Attorney, Agent, or Firm* — Michael A. Davis, Jr.; Charles A. Brill; Frank D. Cimino

(57) ABSTRACT

An electronic device includes a package substrate, a circuit assembly, and a housing. The circuit assembly is mounted on the package substrate. The circuit assembly includes a first sealed cavity formed in a device substrate. The housing is mounted on the package substrate to form a second sealed cavity about the circuit assembly.

14 Claims, 6 Drawing Sheets

(56) References Cited

U.S. PATENT DOCUMENTS

| | | |
|---|---|---|
| 5,107,231 A | 4/1992 | Knox |
| 5,198,786 A | 3/1993 | Russell et al. |
| 5,218,373 A | 6/1993 | Heckaman et al. |
| 5,412,186 A | 5/1995 | Gale |
| 5,459,324 A | 10/1995 | Fima |
| 5,821,836 A | 10/1998 | Katehi et al. |
| 6,131,256 A | 10/2000 | Dydyk et al. |
| 6,236,366 B1 | 5/2001 | Yamamoto et al. |
| 6,362,706 B1 | 3/2002 | Song et al. |
| 6,498,550 B1 | 12/2002 | Miller et al. |
| 6,630,359 B1 | 10/2003 | Caillat et al. |
| 6,670,866 B2 | 12/2003 | Ella et al. |
| 6,842,088 B2 | 1/2005 | Yamada et al. |
| 6,989,723 B2 | 1/2006 | Komuro et al. |
| 6,998,691 B2 | 2/2006 | Baugh |
| 7,388,454 B2 | 6/2008 | Ruby et al. |
| 7,408,428 B2 | 8/2008 | Larson, III |
| 8,098,208 B2 | 1/2012 | Ficker et al. |
| 8,268,642 B2 | 9/2012 | Yoshitomi et al. |
| 8,293,661 B2 | 10/2012 | Yamazaki |
| 8,586,178 B2 | 11/2013 | Schwanke et al. |
| 9,436,902 B1 | 9/2016 | Koepp et al. |
| 9,529,334 B2 | 12/2016 | Herbsommer et al. |
| 9,735,754 B2 | 8/2017 | Shin et al. |
| 2002/0038989 A1 | 4/2002 | Larson, III |
| 2002/0068018 A1 | 6/2002 | Pepper et al. |
| 2002/0098611 A1 | 7/2002 | Chang et al. |
| 2003/0015707 A1 | 1/2003 | Bosco et al. |
| 2003/0048500 A1 | 3/2003 | Fala et al. |
| 2003/0107459 A1 | 6/2003 | Takahashi et al. |
| 2004/0142484 A1 | 7/2004 | Berlin et al. |
| 2004/0166577 A1 | 8/2004 | Storek et al. |
| 2005/0023932 A1 | 2/2005 | Inoue et al. |
| 2006/0022761 A1 | 2/2006 | Abeles |
| 2006/0076632 A1 | 4/2006 | Palmateer et al. |
| 2006/0144150 A1 | 7/2006 | Wu |
| 2007/0189359 A1 | 8/2007 | Chen et al. |
| 2008/0319285 A1 | 12/2008 | Hancock |
| 2010/0182102 A1 | 7/2010 | Kuypers et al. |
| 2010/0259334 A1 | 10/2010 | Briggs |
| 2010/0327701 A1 | 12/2010 | Grannen et al. |
| 2011/0140971 A1 | 6/2011 | Schwanke et al. |
| 2012/0266681 A1 | 10/2012 | Baumann et al. |
| 2013/0176703 A1* | 7/2013 | Hopper ............... H03L 7/26 361/820 |
| 2014/0155295 A1 | 6/2014 | Hindson et al. |
| 2014/0210835 A1 | 7/2014 | Hong et al. |
| 2014/0347074 A1 | 11/2014 | Nadeau |
| 2014/0368376 A1 | 12/2014 | Nadeau et al. |
| 2014/0368377 A1 | 12/2014 | Nadeau et al. |
| 2014/0373599 A1 | 12/2014 | Trombley et al. |
| 2015/0144297 A1 | 5/2015 | Toivonen et al. |
| 2015/0123748 A1 | 7/2015 | Stevenson |
| 2015/0277386 A1 | 10/2015 | Passilly et al. |
| 2016/0091663 A1 | 3/2016 | Taylor |
| 2016/0233178 A1 | 8/2016 | Lamy et al. |
| 2017/0073223 A1 | 3/2017 | Nasiri et al. |
| 2017/0125660 A1 | 5/2017 | Stephanou et al. |
| 2017/0130102 A1 | 5/2017 | Campbell et al. |
| 2018/0159547 A1* | 6/2018 | Herbsommer ............ H03L 7/26 |

OTHER PUBLICATIONS

International Search Report for PCT/US2018/049940 dated Dec. 13, 2018.

International Search Report for PCT/US2018/049949 dated Dec. 13, 2018.

International Search Report for PCT/US2018/049949 dated Dec. 27, 2018.

International Search Report for PCT/US2018/047105 dated Dec. 27, 2018.

International Search Report for PCT/US2018/050253 dated Jan. 10, 2019.

Alvarez, A.L. et al; "The Application of Microencapsulation Techniques in the Treatment of Endodontic and Periodontal Diseases" Pharmaceutics; 2011 abstract pp. 540-548.

Steinberg, D. et al; "A New Degradable Controlled Release Device for Treatment of Periodontal Disease: In Vitro Release Study"; J. Periodontology; 1990; p. 393 lines 1-17; p. 394 col. 1 lines 5-14.

Xiong, R. et al.; "Towards Theranostic Multicompartment Microcapsules: in situ Diagnostics and Laser-induced Treatment", Theranostics; 2013; pp. 145-149.

* cited by examiner

PACKAGING A SEALED CAVITY IN AN ELECTRONIC DEVICE

BACKGROUND

Various applications require that the integrity of a sealed chamber be maintained to insure proper equipment operation. For example, for a housing intended to maintain a low internal pressure, a leak in the housing may allow ingress of gas that dilutes or contaminates the contents of the housing to the extent that housing contents are no longer useable for the intended purpose. In one particular application, the waveguide of a chip-scale atomic clock contains a selected vapor and requires that a predetermined rate of leakage be maintained to insure the pressure of the vapor and proper operation of the clock.

SUMMARY

Techniques for controlling and monitoring leakage into a sealed cavity of a semiconductor device are disclosed herein. In one embodiment, an electronic device includes a package substrate, a circuit assembly, and a housing. The circuit assembly is mounted on the package substrate. The circuit assembly includes a first sealed cavity formed in a device substrate. The housing is mounted on the package substrate to form a second sealed cavity about the circuit assembly.

In another embodiment, a clock generator includes a first hermetically sealed cavity, clock generation circuitry, and a housing. The first hermetically sealed cavity is formed in a first substrate. The first hermetically sealed cavity contains dipolar molecules. The clock generation circuitry is configured to drive a signal into the first hermetically sealed cavity, and to generate an output clock signal at a frequency of quantum rotational state transition of the dipolar molecules. The housing encloses the first hermetically sealed cavity and the clock generation circuitry. The housing forms a second hermitically sealed cavity.

In a further embodiment, an electronic device includes a package substrate, a circuit assembly, a first pressure sensor, a second pressure sensor, and a housing. The circuit assembly is mounted on the package substrate. The circuit assembly includes a first sealed cavity. The first sealed cavity includes a channel formed in a device substrate and a sealing plate bonded to the device substrate. The first pressure sensor is coupled to the sealing plate and is configured to measure pressure within the first sealed cavity as a function of displacement of the sealing plate. The housing is mounted on the package substrate to form a second sealed cavity about the circuit assembly. The second pressure sensor is coupled to the housing and configured to measure pressure within the second sealed cavity as a function of displacement of the housing.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Maintaining reliable operation of a millimeter-wave chip scale atomic clock (mmWCSAC) over a reasonable lifetime (e.g., 3-10 years) requires that portions of the clock operate in a stable, hermetically sealed environment. For example, reliable operation over time may require a wafer scale hermetic seal with a very low leakage rate (e.g., 1E-14 atm-cc/s). Unfortunately, building and validating wafer scale hermetic cavities with such low leakage rates is beyond the capabilities of conventional packaging techniques. Even if such systems can be fabricated in the future, testing hermeticity to such levels remains at the very limits of conventional test facilities. If pressure or humidity within the mmWCSAC drifts too far from the manufacturing specifications, the accuracy of the mmWCSAC may be affected. Therefore the hermeticity and packaging are important to enabling mmWCSAC technology.

The electronic devices disclosed herein provide a very low leakage rate to a cavity formed in a semiconductor material. The hermetic seal associated with such a cavity is incapable of supporting the required leakage rate. Rather, the electronic devices include a housing that surrounds the cavity and circuitry associated with cavity. The housing provides a secondary hermetic seal that operates in conjunction with the hermetic seal associated with the cavity to provide the very low leakage rate. Embodiments of the electronic devices disclosed herein also include sensors that measure the pressure in the cavity and sensors that measure the pressure in the housing. In various embodiments of the electronic devices, the sensors are strain gauges or acoustic transducers.

Figure 1:
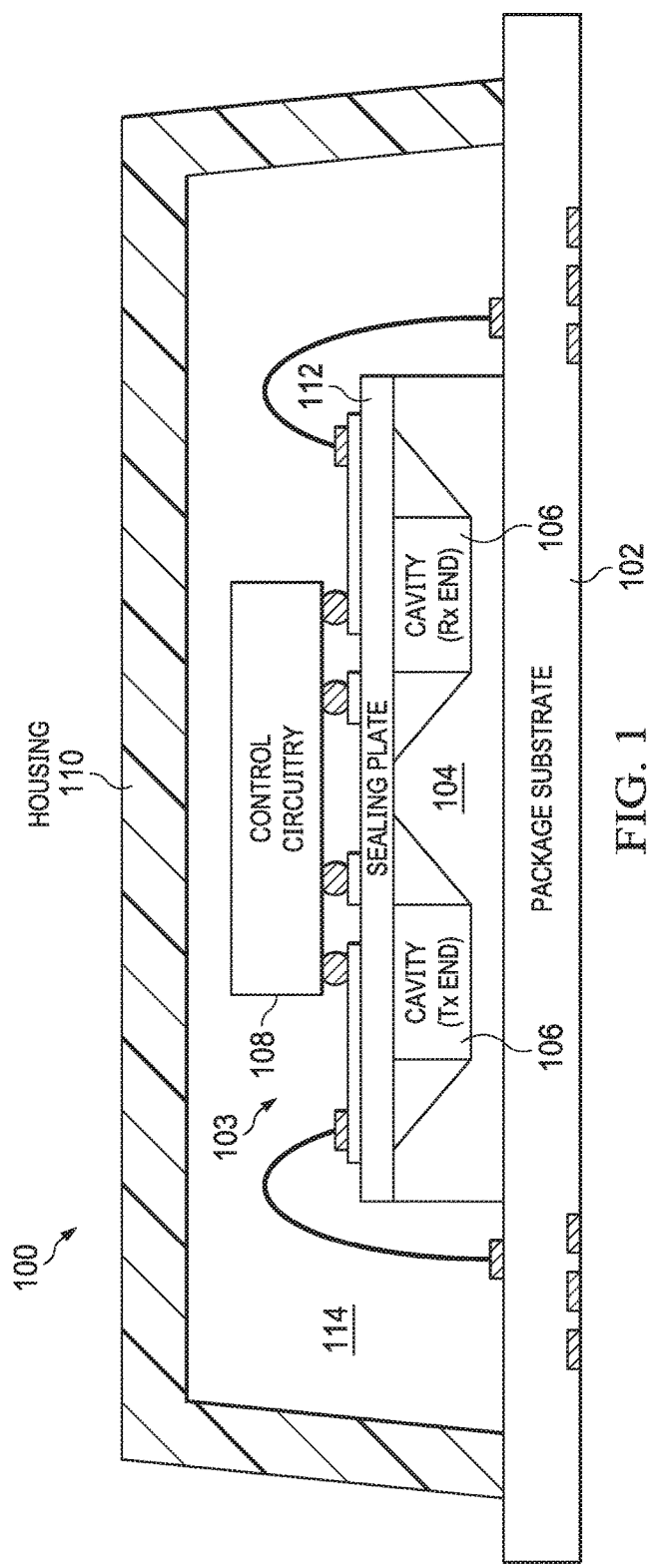
FIG. 1 shows a diagram of an electronic device packaged to provide very low leakage to a chip scale cavity in accordance with various embodiments.

FIG. 1 shows a diagram of an electronic device 100 packaged to provide very low leakage to a chip scale cavity in accordance with various embodiments. In some embodiments, the electronic device 100 is a clock generator, such as mmWCSAC. The electronic device 100 includes a package substrate 102, a circuit assembly 103, and a housing 110. The circuit assembly 103 is mounted to the package substrate 102. The package substrate 102 is formed of ceramic or other suitable material. The circuit assembly 103 includes a device substrate 104, a sealing plate 112, and control circuitry 108. The device substrate 104 is bonded to the package substrate 102. The device substrate 104 includes a cavity 106. The cavity 106 is formed by etching a channel into the device substrate 104. In some embodiments, for example embodiments of a mmWCSAC, the surfaces of the cavity 106 are plated with metal to form a waveguide and the cavity contains dipolar molecules. For example, some embodiments of the cavity 106 contain water molecules in vapor form. The internal pressure of the cavity 106 is set to an optimum value at manufacture by controlling the number of the dipolar molecules present in the cavity 106. In embodiments of the electronic device 100 that implement a mmWCSAC, the frequency of quantum rotational state transition of the dipolar molecules serves as frequency reference for a clock signal generated by the device 100. If the pressure within the cavity 106 varies from the optimum value set at manufacture by an excessive amount, then the accuracy of the clock signal may be affected.

The sealing plate 112 is bonded to the device substrate 104 to hermetically seal the cavity 106. The sealing plate 112 is a dielectric (e.g., glass) membrane in some embodiments. The control circuitry 108 is bonded to metal plated to the top of the sealing plate 106. In embodiments of the electronic device 100 that implement a mmWCSAC, the control circuitry 108 includes clock generation circuitry to drive signal into the cavity 106, to receive signal from the cavity 106, and to process the signal received from the cavity 106 to generate a clock signal that is locked to the frequency of quantum rotational state transition of the dipolar molecules contained in the cavity 106.

To provide a device operational life of at least three years, embodiments of the electronic device 100 ensure a very low rate of leakage into the cavity 106. The principal path for leakage that degrades the performance of the electronic device 100 is from the ambient environment into the cavity 106. If it is assumed that the performance of the electronic device 100 is acceptable with a doubling of pressure within the cavity 106, then an acceptable leakage rate for the cavity 106 can be determined. The leakage rate for the cavity 106 alone can be determined as:

$$\Delta P = (P_{ext} - P_{int})(1 - e^{-Lt/V}) \quad (1)$$

where:
$\Delta P$ is change in pressure in the cavity over time;
$P_{ext}$ is pressure external to the cavity;
$P_{int}$ is internal pressure of the cavity;
L is rate of leakage into the cavity;
V is volume of the cavity; and
t is time.

The cavity 106 alone must have an extremely low leakage rate to maintain intra-cavity pressure within an acceptable range. Embodiments of the electronic device 100 allow the leakage rate of the cavity 106 to be relaxed by disposing the housing 110 about the circuit assembly 103. In some embodiments of the electronic device 100, the housing 110 is mounted to the package substrate 102 to form a hermetically sealed cavity 114 about the device substrate 102 and control circuitry 108. Thus, in the electronic device 100, the cavity 106 formed in the device substrate 104 is enclosed within an outer cavity 114 formed by the housing 110. In some embodiments, the housing 110 is metal, glass, or another material, or combination of materials. For the nested cavities of the electronic device 100, the leakage rates of the two cavities 106 and 114 are coupled as:

$$\Delta P_1 = (P_{ext} - P_1)(1 - e^{-L_1 t/V_1}) \quad (2)$$

$$\Delta P_2 = (P_1 - P_2)(1 - e^{-L_2 t/V_2}) \quad (3)$$

where:
$\Delta P_1$ is change in pressure in the outer cavity 114;
$P_{ext}$ is pressure external to the outer cavity 114;
$P_1$ is internal pressure of the outer cavity 114;
$L_1$ is rate of leakage into the outer cavity 114;
$V_1$ is volume of the outer cavity 114;
$\Delta P_2$ is change in pressure in the inner cavity 106;
$P_2$ is internal pressure of the inner cavity 106;
$L_2$ is rate of leakage into the inner cavity 106;
$V_2$ is volume of the inner cavity 106; and
t is time.

Figure 2:
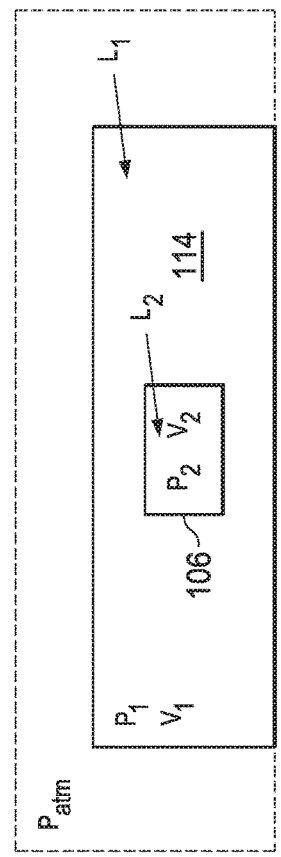
FIG. 2 illustrates leakage conditions in the electronic device of FIG. 1 in accordance with various embodiments.

FIG. 2 illustrates leakage conditions in the electronic device 100. The pressure of the atmosphere ($P_{atm}$) external to the outer cavity 114 induces leakage $L_1$ into the outer cavity 114. The outer cavity 114 has volume $V_1$ and internal pressure $P_1$. The inner cavity 106 has volume $V_2$ and internal pressure $P_2$. The difference in pressures of the internal and external cavities induces leakage $L_2$ from the outer cavity 114 into the inner cavity 106. Given values for the volumes of the cavities 106 and 114 and average change in pressure in the outer cavity 114 ($\Delta P_1$), the relationship between leakage rates and volumes of the cavities 106 and 114 can be determined.

Figure 3:
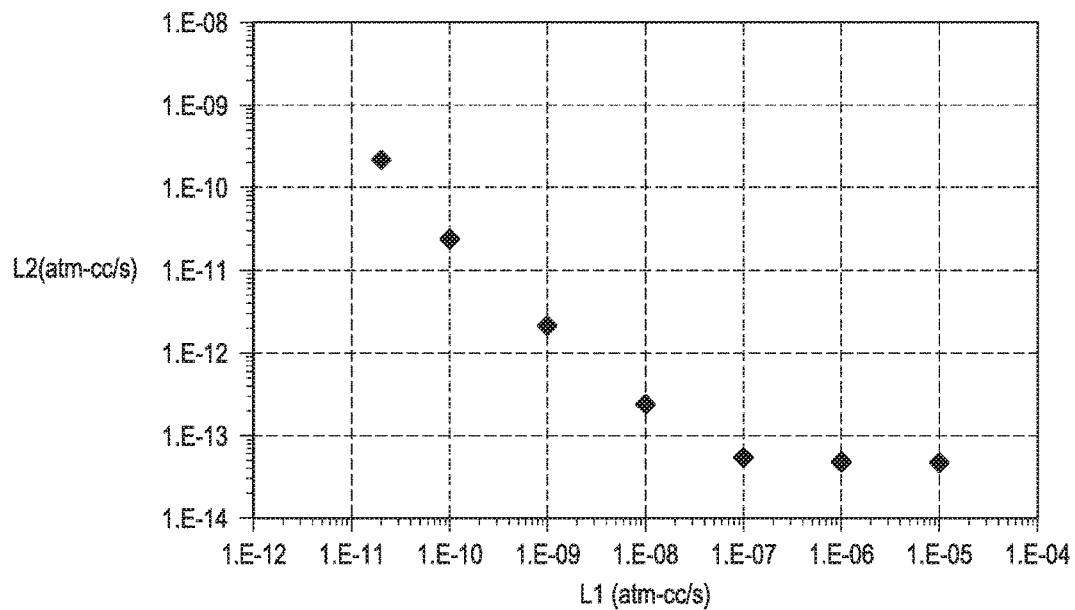
FIG. 3 shows a relationship of the leakage rate of an outer cavity to the leakage rate of an inner cavity, where the inner cavity is disposed within the outer cavity of an electronic device in accordance with various embodiments.

FIG. 3 shows the relationship of the leakage rate of the inner cavity 106 to the leakage rate of the outer cavity 114. FIG. 3 shows that to achieve a given overall leakage rate into the inner cavity 106, the individual leakage rate of the inner cavity 106 may be increased as the leakage rate of the outer cavity 114 is decreased. Similarly, to achieve the given overall leakage rate, the individual leakage rate of the inner cavity 106 must be decreased as the leakage rate of the outer cavity 114 is increased.

Figure 4:
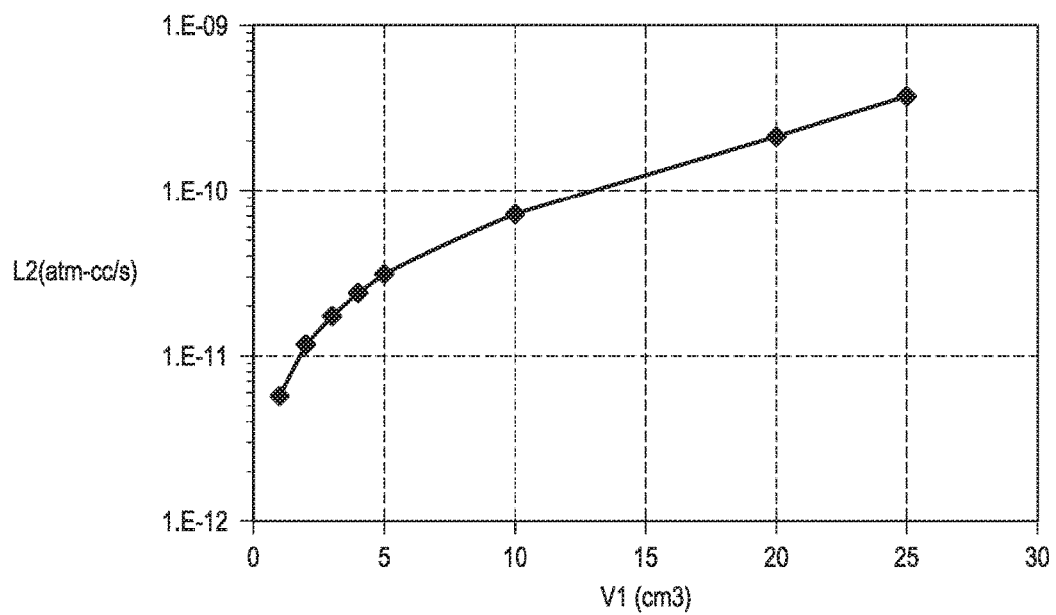
FIG. 4 shows the relationship of the volume of an outer cavity to the leakage rate of an inner cavity, where the inner cavity is disposed within the outer cavity of an electronic device in accordance with various embodiments.

FIG. 4 shows the relationship of the leakage rate of the inner cavity 106 to the volume of an outer cavity 114. FIG. 4 shows that to achieve a given overall leakage rate into the inner cavity 106, the individual leakage rate of the inner cavity 106 may be increased as the volume of the outer cavity 114 is increased. Similarly, to achieve the given overall leakage rate, the individual leakage rate of the inner cavity 106 must be decreased as the volume of the outer cavity 114 is decreased.

Figure 5:
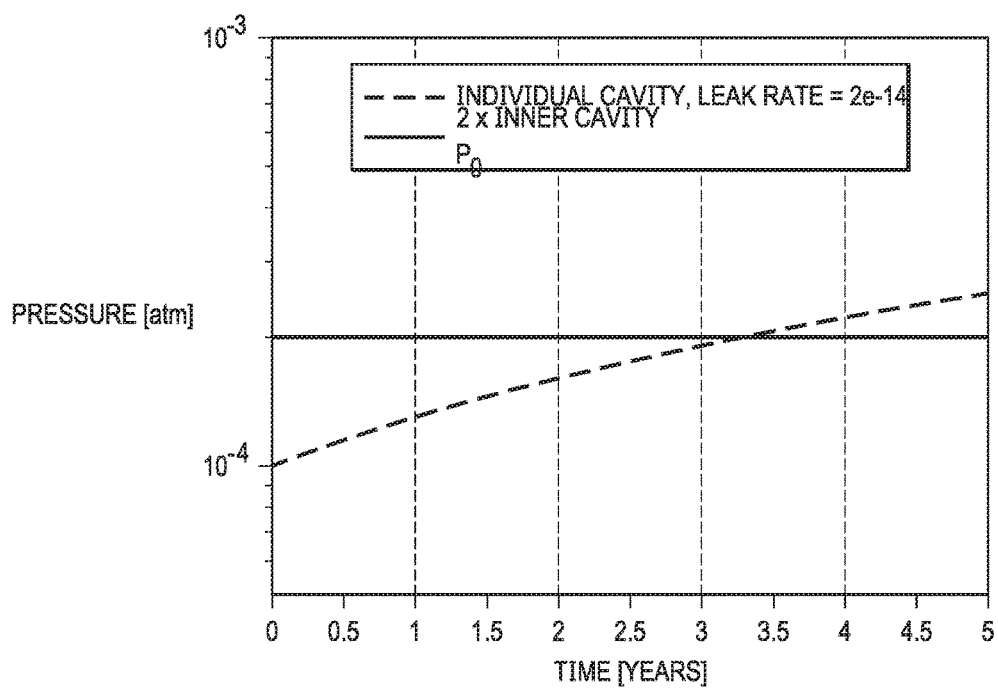
FIG. 5 shows pressure over time for a first cavity that is not enclosed within a second outer cavity.

To maintain pressure suitable for operation of a mmWCSAC in the cavity 106, without the outer cavity 114 formed by the housing 110, a leakage rate on the order of 1E-14 atm-cc/s is required. FIG. 5 shows pressure over time for the inner cavity 106 without the outer cavity 114. FIG. 5 shows that given an initial pressure of $10^{-4}$ atm in the cavity 106 and a leakage rate of 1E-14 atm-cc/s into the cavity 106, without the outer cavity 114, the pressure within the cavity 106 doubles in less than 3.5 years. As previously noted, a leakage rate of 1E-14 atm-cc/s is difficult or impossible to achieve with conventional manufacturing techniques.

Figure 6:
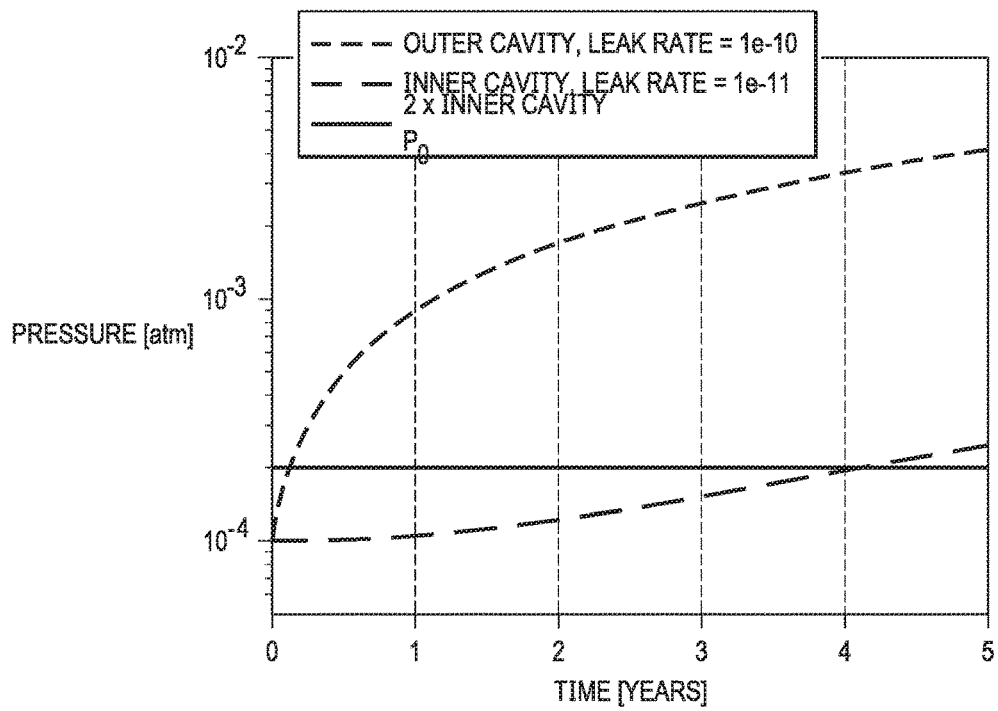
FIG. 6 shows pressure over time for an inner cavity and an outer cavity, where the inner cavity is disposed within the outer cavity of an electronic device in accordance with various embodiments.

FIG. 6 shows pressure over time in the inner cavity 106 with the outer cavity 114 as in the electronic device 100. In FIG. 6, the leakage rate into the outer cavity 114 is 1E-10 atm-cc/s and the leakage rate into the inner cavity 106 is 1E-11 atm-cc/s. The initial pressure in the cavities 106 and 114 is $10^{-4}$ atm. FIG. 6 shows that the in the electronic device 106 the pressure within the cavity 106 doubles in just over four years. Accordingly, embodiments of the electronic device 100 allow the effective leakage rate of the cavity 106 to be greatly reduced (e.g., by three orders of magnitude or more (e.g., 1000, 5000, etc.)) relative to a device that lacks the outer cavity 114. Thus, the electronic device 100 provides a reasonable operating life while relaxing the requirements of individual cavity hermeticity by a factor of 1000 or more and allowing the device's hermetic seals to be manufactured using conventional processes.

Figure 7:
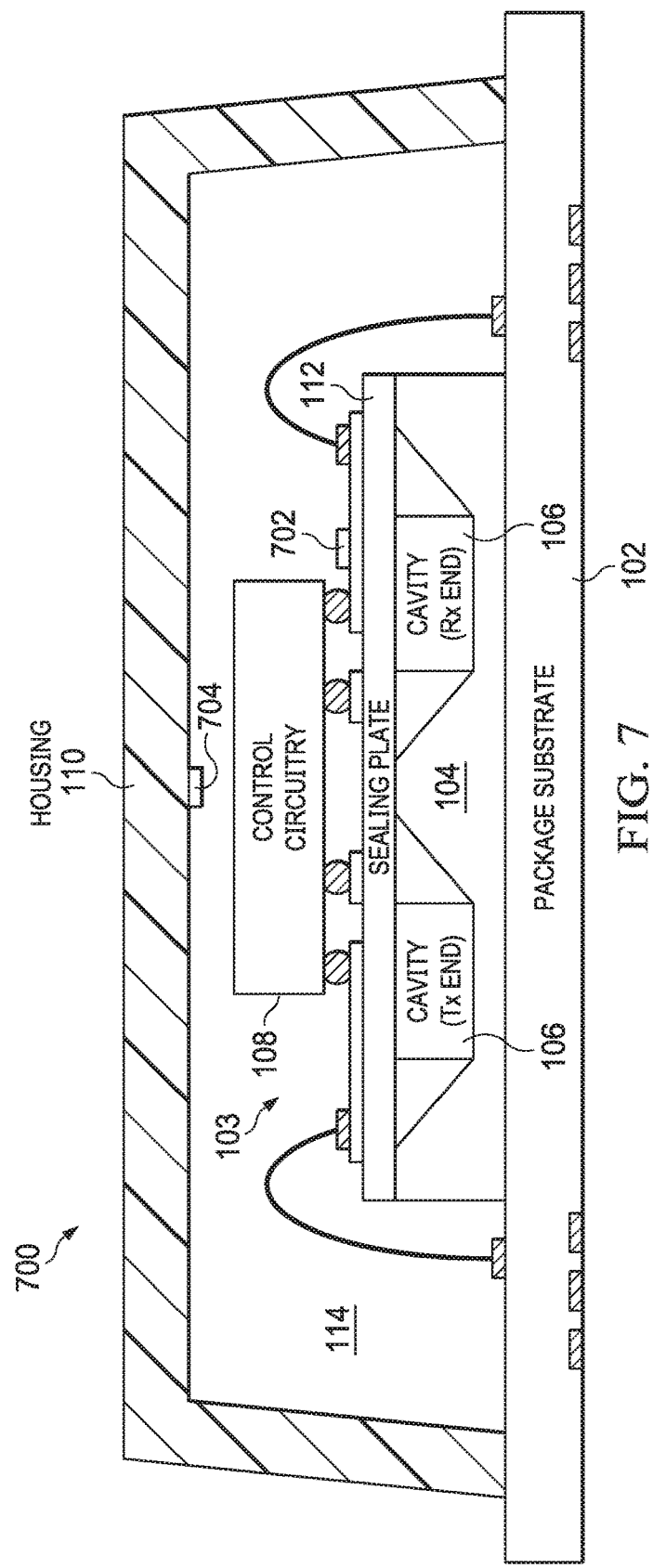
FIG. 7 shows a diagram of an electronic device packaged to provide very low leakage to a chip scale cavity that includes sensors for monitoring the pressure in cavities of the device in accordance with various embodiments.

Some embodiments of the electronic device 100 also include features for monitoring the pressure within the inner cavity 106 and the outer cavity 114. Monitoring cavity pressure allows the operational state of the electronic device 100 to be verified under operating conditions. If the pressure in the cavity 106 exceeds a predetermined level, then some embodiments generate a notification signal to alert higher level systems of the condition of the device 100. FIG. 7 shows a diagram of an electronic device 700 packaged to provide very low leakage to a chip scale cavity that includes sensors for monitoring the pressure in the cavities of the device in accordance with various embodiments. The electronic device 700 is an embodiment of the electronic device 100.

The electronic device 700 includes package substrate 102, a circuit assembly 103, a housing 110, and pressure sensors 702 and 704. The circuit assembly 103 is mounted to the package substrate 102. The circuit assembly 103 includes a device substrate 104, a sealing plate 112, and control circuitry 108. The device substrate 104 is bonded to the package substrate 102. The device substrate 104 includes a cavity 106. The cavity 106 is etched into the device substrate 104. In some embodiments, the surfaces of the cavity 106 are plated with metal to form a waveguide and the cavity contains dipolar molecules. For example, some embodiments of the cavity 106 contain water molecules in vapor form. The internal pressure of the cavity 106 is set to an optimum value at manufacture by controlling the number of the dipolar molecules present in the cavity 106. In embodiments of the electronic device 100 that implement a mmW-CSAC, the quantum rotation frequency of the dipolar molecules serves as frequency reference for a clock signal generated by the device 100. If the pressure within the cavity 106 varies from the optimum value set at manufacture by an excessive amount, then the accuracy of the clock signal may be affected.

The sealing plate 112 is bonded to the device substrate 104 to hermetically seal the cavity 106. The sealing plate 112 is a dielectric (e.g., glass) membrane in some embodiments. The control circuitry 108 is bonded to metal plated to the top of the sealing plate 106. In embodiments of the electronic device 700 that implement a mmWCSAC, the control circuitry 108 includes clock generation circuitry to drive signal into the cavity 106, to receive signal from the cavity 106, and to process the signal received from the cavity 106 to generate a clock signal that is locked to the quantum rotation frequency of the dipolar molecules contained in the cavity 106.

Embodiments of the electronic device 700 allow the leakage rate of the cavity 106 to be relaxed by disposing the housing 110 about the device substrate 104. In some embodiments of the electronic device 100, the housing 110 is mounted to the package substrate 102 to form a hermetically sealed cavity 114 about the device substrate 102 and control circuitry 108. Thus, in the electronic device 700, the cavity 106 formed in the device substrate 104 is enclosed within an outer cavity 114 formed by the housing 110. In some embodiments, the housing 110 is metal, glass, or another material or combination of materials.

The pressure sensors 702 and 704 are disposed to measure the pressure in the inner cavity 106 and the outer cavity 114 respectively. For example, the pressure sensor 702 is coupled to the sealing plate 112 to measure pressure within the inner cavity 106, and the pressure sensor 704 is coupled to the housing 110 to measure pressure within the outer cavity 114. The pressure sensor 702 is coupled to the sealing plate 112 at a location in which the inner cavity 106 is adjacent to the sealing plate 112. Similarly, the pressure sensor 704 is coupled to the housing 110 at a location of the housing 110 most likely to be affected by a change in pressure of the outer cavity 114.

Figure 8:
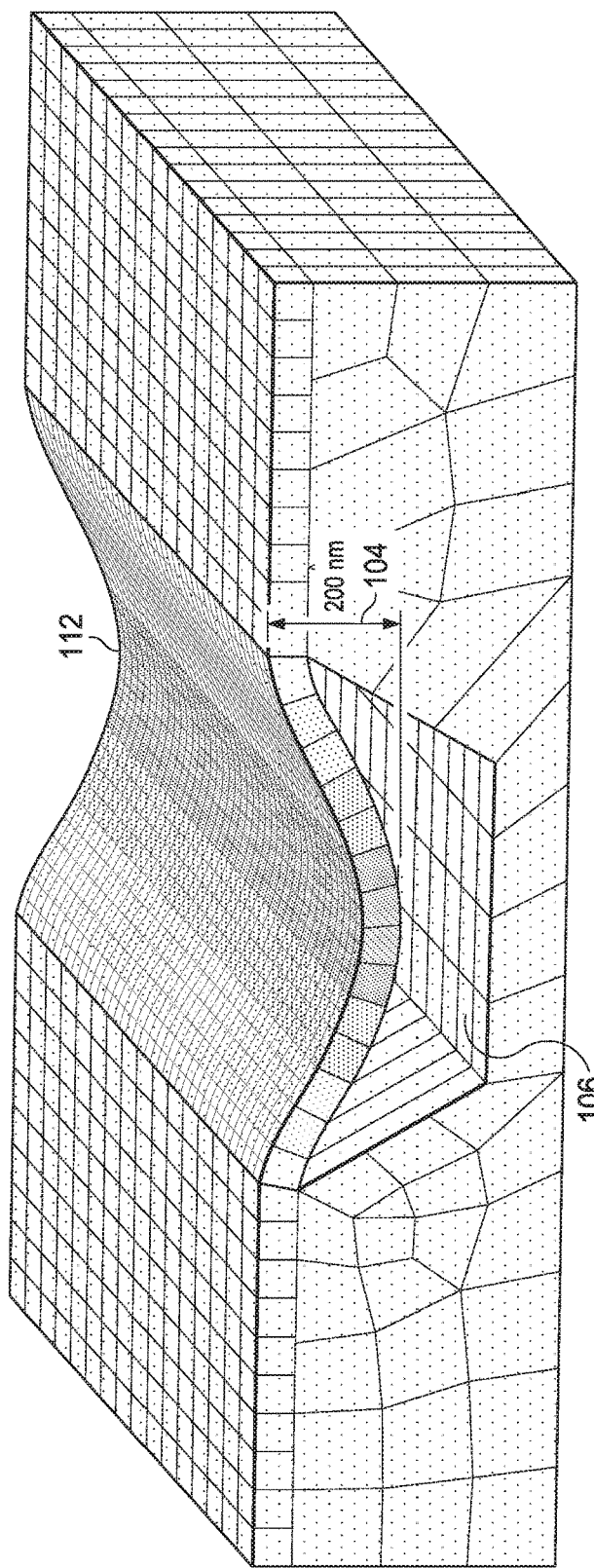
FIG. 8 shows pressure related displacement of a sealing plate that hermetically seals a cavity formed in a semiconductor substrate in accordance with various embodiments.

In some embodiments of the electronic device 700, the pressure sensors 702 and 704 are strain gauges that measure the deflection or displacement of the sealing plate 112 and the housing 110 respectively. Displacement of the sealing plate 112 is representative of the pressure within the inner cavity 106. For example, as the forces exerted on the sealing plate 112 by the pressures in the inner cavity 106 and the outer cavity 114 change, the displacement of the sealing plate 112 also changes. FIG. 8 shows an example of displacement of the sealing plate 112 that is measureable by the pressure sensor 702.

Some embodiments of the control circuitry 108 include circuitry to receive signals from the pressure sensors 702 and 704, and to determine values of pressure in the inner cavity 106 and the outer cavity 114 based on the signals. For example, circuits in the control circuitry 108 digitize the signals received from the pressure sensors 702 and 704, and access a table that relates displacement values to cavity pressure values, or evaluate a function that produces cavity pressure values based on the displacement values. In such embodiments, the control circuitry 108 includes an analog-to-digital converter to digitize the signals generated by the pressure sensors 702 and 704, a microcontroller and associated programming to generate pressure values based on the digitized signals, or other circuitry suitable for generating pressure values based on displacement signals.

Figure 9:
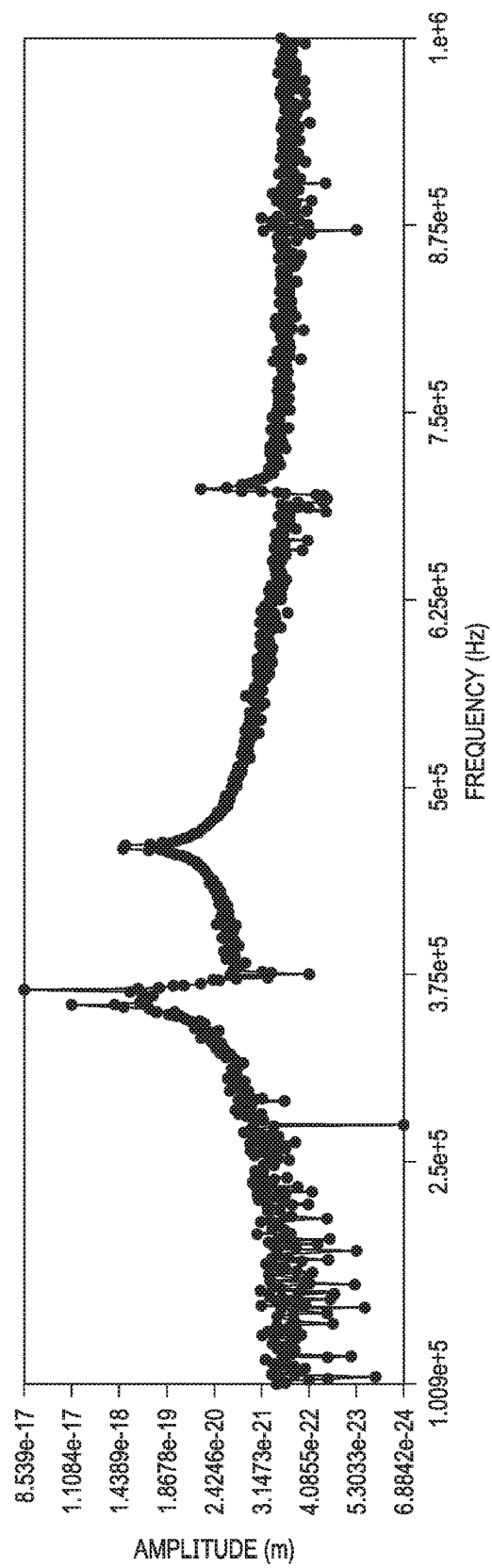
FIG. 9 shows resonant signature tracking employed to determine the pressure within an inner or outer cavity of an electronic device in accordance with various embodiments.

In some embodiments of the electronic device 700, the pressure sensors 702 and 704 are acoustic transducers that detect vibration of the sealing plate 112 and the housing 110 respectively. The resonant frequencies of the sealing plate 106 and the housing 110 are representative of the pressures within the inner cavity 106 and the outer cavity 114. For example, as the pressure within the inner cavity 106 increases the resonant frequency of the sealing plate 112 also increases. Similarly, as the pressure within the outer cavity 114 increases, the resonant frequency of the housing 110 increases. FIG. 9 shows an example of tracking of the resonant frequency of the sealing plate 112.

Some embodiments of the control circuitry 108 include circuits to receive signals from the pressure sensors 702 and 704, and to determine values of pressure in the inner cavity 106 and the outer cavity 114 based on the signals. For example, circuits in the control circuitry 108 digitize the signals received from the pressure sensors 702 and 704, and analyze the frequency content of the signals to determine the mechanical harmonic signature of the sealing plate 112 and/or the housing 110. The control circuitry 108 accesses a table that relates harmonic signature to cavity pressure values, or evaluates a function that produces cavity pressure values based on harmonic signature. In such embodiments, the control circuitry 108 includes an analog-to-digital converter to digitize the signals generated by the pressure sensors 702 and 704, a microcontroller and associated programming, or other suitable circuitry, to analyze the frequency content of the digitized signals, determine a harmonic signature of the sealing plate 112 and/or the housing 110, and determine a value of pressure based on the harmonic signature.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A clock generator, comprising:
   a substrate having a first sealed cavity, the first sealed cavity containing dipolar molecules;
   clock generation circuitry coupled to the substrate, the clock generation circuitry configured to drive a signal into the first sealed cavity and, responsive to the driven signal, generate a clock signal at a frequency of quantum rotational state transition of the dipolar molecules; and
   a housing having a second sealed cavity, the second sealed cavity enclosing the substrate and the clock generation circuitry.

2. The clock generator of claim 1, wherein the substrate is a first substrate, and the clock generator further comprises a second substrate bonded to the housing to form the second sealed cavity.

3. The clock generator of claim 1, wherein the clock generator further comprises a plate bonded to the substrate to form the first sealed cavity.

4. The clock generator of claim 3, wherein the plate includes a dielectric membrane.

5. The clock generator of claim 3, further comprising a pressure sensor coupled to the plate, the pressure sensor configured to measure a pressure within the first sealed cavity responsive to a displacement of the plate.

6. The clock generator of claim 5, wherein the pressure sensor is a first pressure sensor, and the clock generator further comprises a second pressure sensor coupled to the housing, the second pressure sensor configured to measure a pressure within the second sealed cavity responsive to a displacement of the housing.

7. The clock generator of claim 3, further comprising:
   an acoustic sensor coupled to the plate, the acoustic sensor configured to measure a vibration of the plate; and
   control circuitry coupled to the acoustic sensor, the control circuitry configured to measure a pressure within the first sealed cavity responsive to the vibration of the plate.

8. The clock generator of claim 7, wherein the acoustic sensor is a first acoustic sensor, the control circuitry is first control circuitry, and the clock generator further comprises:
   a second acoustic sensor coupled to the housing, the second acoustic sensor configured to measure a vibration of the housing; and
   second control circuitry coupled to the second acoustic sensor, the second control circuitry configured to measure a pressure within the second sealed cavity responsive to the vibration of the housing.

9. The clock generator of claim 1, further comprising a pressure sensor coupled to the housing, the pressure sensor configured to measure a pressure within the second sealed cavity responsive to a displacement of the housing.

10. The clock generator of claim 1, further comprising:
    an acoustic sensor coupled to the housing, the acoustic sensor and configured to measure a vibration of the housing; and
    control circuitry coupled to the acoustic sensor, the control circuitry configured to measure a pressure within the second sealed cavity responsive to the vibration of the housing.

11. The clock generator of claim 1, wherein the first sealed cavity is a waveguide of a millimeter-wave wave chip scale atomic clock.

12. The clock generator of claim 1, wherein the first cavity is hermetically sealed.

13. The clock generator of claim 12, wherein the second cavity is hermetically sealed.

14. The clock generator of claim 1, wherein the second cavity is hermetically sealed.

* * * * *